United States Patent [19]

McAndrew

[11] Patent Number: 4,606,120

[45] Date of Patent: Aug. 19, 1986

[54] PROCESS FOR MOUNTING COMPONENTS ON A PRINTED CIRCUIT BOARD

[75] Inventor: James A. McAndrew, Endwell, N.Y.

[73] Assignee: General Electric Company, Binghamton, N.Y.

[21] Appl. No.: 673,303

[22] Filed: Nov. 20, 1984

Related U.S. Application Data

[63] Continuation-in-part of Ser. No. 545,559, Oct. 26, 1983, abandoned.

[51] Int. Cl.$^4$ ............................................. H05K 3/30
[52] U.S. Cl. ........................................ 29/837; 29/739; 29/840; 174/138 G; 357/74
[58] Field of Search ................. 29/837, 739, 827, 840; 339/17 C; 357/74; 174/138 G; 24/563, 543

[56] References Cited

U.S. PATENT DOCUMENTS

| | | | |
|---|---|---|---|
| 2,990,501 | 6/1961 | Cornelison et al. | 29/827 X |
| 3,793,720 | 2/1979 | Van Rijsewijk et al. | 29/739 X |
| 3,962,719 | 6/1976 | Pfaff | 357/74 |
| 3,972,356 | 8/1976 | Kjarsgaard | 29/749 X |

Primary Examiner—Howard N. Goldberg
Assistant Examiner—Carl J. Arbes
Attorney, Agent, or Firm—I. David Blumenfeld

[57] ABSTRACT

A spacer device for mounting electrical components on a printed wire board includes a spacer having two legs projecting from a body to form a general U-shape. Each of the legs has a slot formed in its end wall for receiving and retaining one of the wire leads of an electrical component. During mounting of the electrical component, the spacer device is snapped onto the component by force fitting the component leads into the respective slots in the spacer legs such that the component is held between the spacer legs. The spacer device remains attached to the electrical component during soldering and provides, by virtue of the thickness of one of the spacer legs, the required spacing of the component from the printed wire board. After soldering, the spacer device can be retained on the component and moved radially about the component to permit inspection of the component solder joint. Alternately, the spacer device can be removed after soldering by simply unsnapping it from the component leads.

3 Claims, 4 Drawing Figures

PROCESS FOR MOUNTING COMPONENTS ON A PRINTED CIRCUIT BOARD

This invention is a Continuation-In-Part of Application for U.S. Letters Patent, Ser. No. 545,559, filed Oct. 26, 1983 now abandoned.

BACKGROUND OF THE INVENTION

1. Field of the Invention

The present invention relates to a process for mounting of electrical components on printed circuit boards (also known as "printed wire boards"), and more particularly to a spacer device used for spacing a vertically mounted electrical component away from the solder termination on the printed wire board.

2. Description of the Prior Art

Present military and commercial requirements for components on printed wire boards generally specify that the component body must be spaced a minimum distance, such as 0.015 inch, away from the printed wire board. Some known methods for accomplishing this spacing function commonly include a ring or washer-like spacer having one or more holes therein through which the component wire leads pass. One such known spacer is donut-shaped and has a central hole for receiving the component wire lead. Such spacer is held between the body of the component and the printed wire board and is of the thickness for meeting the spacing requirement. This type of spacer is of permanent nature in that it is permanently secured around the component wire and is positioned between the component and the printed wire board. Such ring-shaped spacers have also been made of material that dissolves from the heat of the soldering operation. Another type of known spacer comprises a generally elongated flat sheet of material having the desired spacing thickness and a pair of holes through which both leads of the component are threaded. Another type of two-holed spacer presently known comprises a T shaped supporting spacer with a base portion having two holes into which the component leads are threaded and an upright portion extending at right angles from such base portion. All of the above-described methods require the assembler to thread one or more of the component leads through a small hole and then hold the spacer to the component until it is assembled on the printed wire board. This operation is very tedious and time consuming. Also, the known spacers that are permanently mounted between the component and the printed wire board present an obstruction for purposes of inspecting the component solder joint.

OBJECTS OF THE INVENTION

It is an object to the present invention to provide an easy and quick method of spacing vertically mounted components away from the solder termination on a printed wire board.

It is another object of the invention to facilitate the assembly of components to a printed wire board.

It is further an object of the invention to facilitate the assembly of a spacer to an electrical component.

Other objects of the invention will be pointed out hereinafter.

SUMMARY OF THE INVENTION

These and other objects are achieved by the present invention which provides a spacer device for mounting electrical components on a printed wire board and includes a spacer body having a projecting leg connected at each of the two respective opposite ends of such body and extending perpendicularly therefrom to form a general U-shape. Each of the two legs has a slot formed in the end wall which is adapted for receiving and retaining therein one of the wire leads of the electrical component. In the process for mounting of the electrical component, the spacer device is snapped onto the component as a first step by force fitting the component leads into the respective slots in the spacer legs such that the component is held between the spacer legs. As the next step the combination of spacer and component are mounted to a board attaching or passing component leads to the board. The spacer device remains attached to the electrical component during soldering and provides, by virtue of the thickness of one of the spacer legs, the required spacing of the component from the printed wire board. After soldering, the spacer device can be retained on the component and moved radially about the component to permit inspection of the component solder joint. Alternatively, the spacer device can be removed after soldering by simply unsnapping it from the component leads, after which the spacer device can be reused.

The spacer device of the present invention provides a quick and easy means for assembling a component on a printed wire board, and facilitates both the assembly of the spacer onto the component and thereafter the assembly of the component, with the spacer, onto the printed wire board.

DESCRIPTION OF THE PREFERRED EMBODIMENT

Figure 1:
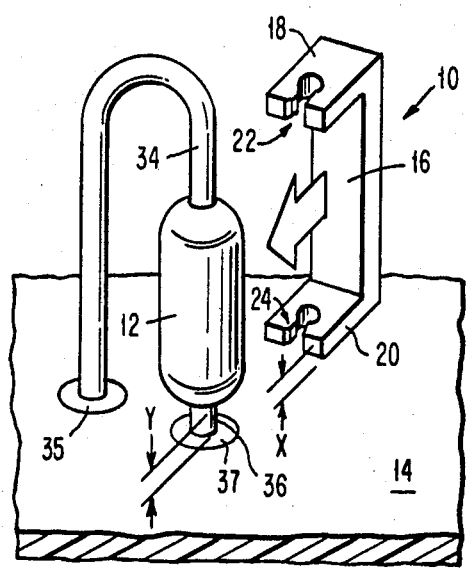
FIG. 1 is a perspective view of the spacer device separated from the component and printed wire board in accordance with the present invention.

Referring to FIG. 1, there is shown a perspective view of a spacer device 10, hereinafter referred to as "spacer", of the present invention located adjacent to a typical electrical component 12 shown vertically mounted on a printed wire board 14. Spacer 10 is made of a rigid material which is electrically insulating, such as a plastic, rubber or plastic polycarbonate material, to permit such spacer to come into physical contact with the lead wires of component 12, as will be described below. Spacer 10 includes an elongated rectangularly shaped body portion 16 and two projecting leg portions 18 and 20 extending perpendicularly from the respective ends of body portion 16 to form a general U-shape. It is to be understood that the particular size and shape of body portion 16 and leg portions 18 and 20 can be varied in accordance with the size and shape of the component to which spacer 10 is mounted.

Figure 3:
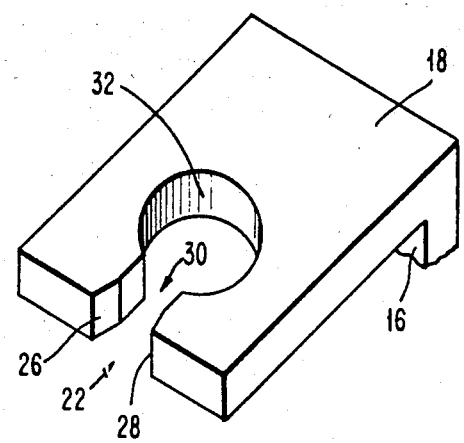
FIG. 3 is a close-up view of the leg portion of the spacer with its slot for receiving a component wire.

Leg portions 18 and 20 of spacer 10 have a notch or slot 22 and 24, respectively, formed in the end wall section. As shown in the detailed view of FIG. 3, slot 22 and slot 24 (not shown) each have inwardly converging wall sections 26 and 28 which define a constricted passage 30 leading into a wire retaining slot 32. Slot 32 is shown in FIG. 3 as a circular opening or orifice. Constricted passages 30 are slightly smaller than the thickness of wire leads 34 and 36 on component 12 such that spacer 10 can be snapped into place on component 12 by forcing leads 34 and 36 to spread the wall sections 26 and 28 apart sufficiently so that leads 34 and 36 pass through constricted passages 30 and into wire retaining slots 32.

Figure 4:
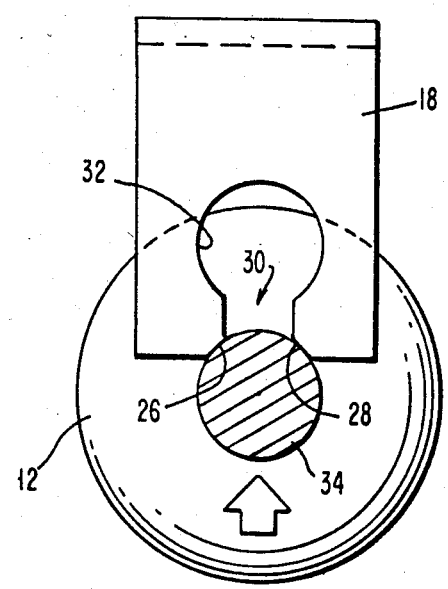
FIG. 4 is a plan view of the component wire in the position where it abuts the spacer leg prior to being snapped into the slot.

FIG. 4 shows a component wire 34 abutting wall sections 26 and 28 of spacer 10 prior to being snapped through constricted passage 30 and into slot 32.

Figure 2:
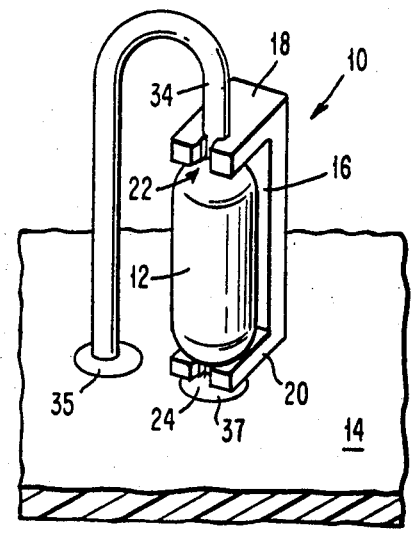
FIG. 2 is an elevation view of the spacer device shown in FIG. 1, after attachment to a vertically mounted electrical component on a printed wire board.

Lower leg portion 20 of spacer 10 shown in FIG. 1 has a thickness "X" which is at least equal to the minimum spacing requirement Y, such as 0.015 inch, between the body of component 12 and printed wire board 14. When spacer 10 is attached to leads 34 and 36 of component 12, as shown in FIG. 2, lower leg portion 20 is located between the lower end of the body of component 12 and printed wire board 14 and thereby serves as a spacer. Leads 34 and 36 are attached to printed wire board 14 at board locations 35 and 37, respectively.

Spacer 10 enables a simple and quick assembly of component 12 to printed wire board 14. Once snapped onto leads 34 and 36 of component 12, spacer 10 does not fall off, and the insertion of the leads 34 and 36 into the printed wire board 14 becomes a simple operation. Spacer 10 remains assembled to component 12 during the soldering operation and, as stated above, provides the required spacing of the body of component 12 from printed wire board 14. Soldering can be performed on a wave soldering machine, using standard wave soldering techniques applied to the back (non-component) side of the printed wiring board. After the soldering operation, spacer 10 may be left assembled to component 12 and conformally coated with an approved coating, or removed by unsnapping the spacer from the component leads. If removed, spacer 10 can be reused on subsequent component assemblies. Several spacer sizes can be adopted for different component sizes by adapting the slots to accommodate the appropriate lead diameters. Also, the width and length of the spacer can be varied to accommodate the component size and spacer requirements. The differently sized spacers also can be color coded to provide easy identification for each specific size.

From the above it can be seen that the present invention provides an easy method of spacing vertically mounted components away from the solder terminations on a printed wire board. The snap-on spacer permits easy assembly to the component as well as providing easy assembly of the component to the printed wire board. After soldering the component to the printed wire board, if the spacer is left assembled to the component, it can be moved radially about the component to allow for inspection of the component solder joint. The simple, yet flexible and accurate process for mounting electrical components to the printed circuit board only requires a very inexpensive, yet effective spacer device. This results in a very economical printed circuit board assembly technique.

It should be understood that the embodiment of the invention described herein is intended to be illustrative of the invention and that various changes can be made to such embodiment without departing from the spirit and scope of the invention.

I claim:

1. In a process for assembling an electrical component having leads extending therefrom to a mounting board, the steps comprising:
   (a) inserting an electrical component having at least two axially aligned leads extending therefrom into the receiving areas in two spatially separated support arms of a component support element through resilient passages in said arms,
   (b) inserting one of said component leads held in the receiving areas in one of said arms into an opening on a mounting board so as to space said component from said support mounting board by a predetermined distance,
   (c) affixing said lead to said mounting board while maintaining the component at said predetermined distance from said mounting board,
   (d) removing said support element from said lead thereby leaving said component affixed to the mounting board and spaced therefrom by said predetermined distance.

2. The process according to claim 1 including the steps of radially moving said spacing element about said lead to inspect the area where said lead is affixed to said support element.

3. The process according to claim 1 wherein the lead extending from said electrical component is forced through the resilient constricted passage into said opening.

* * * * *